US 8,710,615 B2

(12) United States Patent
Schmidt

(10) Patent No.: US 8,710,615 B2
(45) Date of Patent: Apr. 29, 2014

(54) SEMICONDUCTOR DEVICE WITH AN AMORPHOUS SEMI-INSULATING LAYER, TEMPERATURE SENSOR, AND METHOD OF MANUFACTURING A SEMICONDUCTOR DEVICE

(75) Inventor: Gerhard Schmidt, Wernberg-Wudmath (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/222,048

(22) Filed: Aug. 31, 2011

(65) Prior Publication Data
US 2013/0049159 A1    Feb. 28, 2013

(51) Int. Cl.
*H01L 31/08* (2006.01)

(52) U.S. Cl.
USPC ............ 257/467; 257/646; 257/468; 257/469; 257/470; 257/930; 438/54

(58) Field of Classification Search
USPC .............................. 257/426, 469, 470, E23.08
See application file for complete search history.

(56) References Cited

U.S. PATENT DOCUMENTS

| | | | | |
|---|---|---|---|---|
| 3,719,797 A * | 3/1973 | Andrews et al. | ............. | 219/501 |
| 3,735,321 A * | 5/1973 | Bovenkerk | ................ | 338/22 R |
| 4,754,254 A * | 6/1988 | Hosokawa et al. | ............. | 338/25 |
| 5,066,938 A | 11/1991 | Kobashi et al. | | |
| 5,072,262 A * | 12/1991 | Uekita et al. | .................. | 257/410 |
| 6,410,941 B1 * | 6/2002 | Taylor et al. | .................... | 257/84 |
| 6,414,740 B1 * | 7/2002 | Hosoyamada | ................ | 349/161 |
| 6,489,616 B2 * | 12/2002 | Giedd | ........................ | 250/338.1 |
| 6,891,278 B2 * | 5/2005 | Muller et al. | ................ | 257/706 |
| 7,473,030 B2 * | 1/2009 | Bruce et al. | ..................... | 374/31 |
| 8,058,675 B2 * | 11/2011 | Kimura | .......................... | 257/290 |
| 2001/0013831 A1 * | 8/2001 | Harling et al. | .................. | 340/587 |
| 2002/0067683 A1 * | 6/2002 | Iverson et al. | ................ | 369/126 |
| 2002/0124955 A1 * | 9/2002 | Tung et al. | ..................... | 156/300 |
| 2002/0134939 A1 * | 9/2002 | Giedd | ........................ | 250/338.1 |
| 2003/0015767 A1 * | 1/2003 | Emrick et al. | ................ | 257/528 |
| 2003/0020072 A1 * | 1/2003 | Higgins | ........................ | 257/78 |
| 2003/0020132 A1 * | 1/2003 | Cornett | ......................... | 257/468 |
| 2004/0031311 A1 * | 2/2004 | Meyer et al. | ......................... | 73/7 |
| 2004/0046223 A1 * | 3/2004 | Muller et al. | ................. | 257/467 |
| 2005/0254552 A1 * | 11/2005 | Bruce et al. | .................... | 374/208 |
| 2008/0116537 A1 * | 5/2008 | Adkisson et al. | ............. | 257/448 |
| 2008/0246064 A1 * | 10/2008 | Kimura | ......................... | 257/292 |
| 2008/0258133 A1 * | 10/2008 | Seong | ............................. | 257/14 |
| 2010/0190296 A1 * | 7/2010 | Kawana et al. | ................. | 438/113 |
| 2011/0090006 A1 * | 4/2011 | Yamazaki et al. | ............. | 327/581 |
| 2011/0102127 A1 * | 5/2011 | Schultes et al. | ............... | 338/223 |
| 2011/0183470 A1 * | 7/2011 | Watanabe | ..................... | 438/114 |
| 2011/0274140 A1 * | 11/2011 | Takatori | ........................ | 374/178 |
| 2012/0045615 A1 * | 2/2012 | Kirkpatrick et al. | .......... | 428/141 |

FOREIGN PATENT DOCUMENTS

WO    2004 025234 A1    3/2004

OTHER PUBLICATIONS

Casady et al., A hybrid 6H-SiC temperature sensor operational from 25C to 500C, IEEE Transactions on Components, Packaging, and Manufacturing Technology—Part A, vol. 19, No. 3, p. 416, Sep. 1996.*

* cited by examiner

*Primary Examiner* — Julio J Maldonado
*Assistant Examiner* — Jaehwan Oh
(74) *Attorney, Agent, or Firm* — Murphy, Bilak & Homiller, PLLC

(57) ABSTRACT

According to an embodiment, a semiconductor device includes a semiconductor substrate and an amorphous semi-insulating layer on the semiconductor substrate.

21 Claims, 5 Drawing Sheets

SEMICONDUCTOR DEVICE WITH AN AMORPHOUS SEMI-INSULATING LAYER, TEMPERATURE SENSOR, AND METHOD OF MANUFACTURING A SEMICONDUCTOR DEVICE

TECHNICAL FIELD

Embodiments described herein relate to semiconductor devices with an amorphous semi-insulating layer, temperature sensors having an amorphous semi-insulating layer, and methods for manufacturing a plurality of semiconductor devices.

BACKGROUND

Fast switching high-voltage power devices such as IGBTs (Insulated Gate Bipolar Transistors) are used for controlling inductive loads in converters for variable speed drives. The inductive loads are, for example, electric motors. Such power devices are designed, depending on the intended use, to block some 100 V up to 6.5 kV. The converters include bridge circuits formed by power devices which are alternatingly switched on and off to generate an output voltage signal having a desired frequency. This is also known as pulse-width modulation (PWM). Multiple power devices can be combined, together with their free-wheeling diodes, in a module for high-voltage and high-current applications.

The power devices may generate heat during operation caused by switching losses and overload situations. For standard operation, the generated heat can be dissipated by a heat sink which is thermally coupled with the power devices. On the other hand, a temperature detection is often desired to monitor the temperature of the power devices and to ensure that the devices do not overheat. A temperature sensor is thus desired.

Conventionally, so-called PTC- or NTC-resistors have been integrated into power devices. PTC-resistors (positive temperature coefficient resistor) are resistors having a resistance which increases with the temperature. Different thereto are NTC-resistors (negative temperature coefficient resistor), the resistance of which decreases with temperature. Each type of resistors is defined by its specific temperature coefficient TC which is a measure to what extent the resistance changes with the temperature. A linear relation between resistance and temperature is desirable.

Typical PTC-resistors, sometimes also referred to as cold conductors, are metals. For example platinum-based temperature sensors (Pt100) are often used in high temperature applications such as in furnaces. Such sensors exhibit a good linearity but have only a comparably small temperature coefficient of about 3.9‰ per ° C. Other materials are semiconducting polycrystalline ceramics such as $BaTiO_3$ which build up a depletion layer on grain boundaries. Although these materials have a higher temperature coefficient than many metals, their linearity is unsatisfactory.

NTC-resistors are, for example, pure semiconductor materials, the carrier density of which increases with the temperature which results in a reduced resistance at elevated temperatures. However, the resistance of the semiconductor materials obeys an exponential temperature dependence.

Another option for measuring the temperature is the use of a forwardly biased pn-junction, the resistance of which is temperature dependent. A pn-junction has a good linearity but only a limited temperature resolution in a range of about −2 mV per ° C. This is often too small to obtain a temperature resolution of about 5° C. since manufacturing variations may lead to deviations between individual temperature sensors which can be higher than 10 mV. To avoid parasitic heating of the temperature sensors caused by the current flow therethrough, only small currents of about 1 $mA/mm^2$ should be supplied to the pn-junction. This reduces the temperature coefficient even further. Hence, an individual calibration is needed. Replacement or exchange of power devices can therefore only take place after careful pre-selection with respect to the temperature characteristics of their temperature sensors.

SUMMARY

According to an embodiment, a semiconductor device having a semiconductor substrate is provided. The semiconductor device includes an amorphous semi-insulating layer on the semiconductor substrate.

According to an embodiment, a temperature sensor is provided having an amorphous semi-insulating layer.

According to an embodiment, a method of manufacturing a semiconductor device is provided. The method includes providing a semiconductor substrate, and forming an amorphous semi-insulating layer on the semiconductor substrate.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which are shown by way of illustration specific embodiments in which the invention may be practiced. In this regard, directional terminology, such as "top", "bottom", "front", "back", "leading", "trailing" etc., is used with reference to the orientation of the Figure(s) being described. Because components of embodiments can be positioned in a number of different orientations, the directional terminology is used for purpose of illustration and is in no way limiting. It is to be understood that other embodiments may be utilised and structural or logical changes may be made without departing from the scope of the present invention. The following detailed description, therefore, is not to be taken in a limiting sense, and the scope of the present invention is defined by the appended claims. The embodiments being described use specific language, which should not be construed as limiting the scope of the appended claims.

It is to be understood that features of the various exemplary embodiments described herein may be combined with each other, unless specifically noted otherwise. For example, features illustrated or described as part of one embodiment can be used in conjunction with features of other embodiments to yield yet a further embodiment. It is intended that the present description includes such modifications and variations.

The term "lateral" as used in this specification intends to describe an orientation parallel to the main surface of a semiconductor substrate.

The term "vertical" as used in this specification intends to describe an orientation, which is arranged perpendicular to the main surface of the semiconductor substrate.

In this specification, a second surface of a semiconductor substrate is considered to be formed by the lower or back-side surface while a first surface is considered to be formed by the upper, front or main surface of the semiconductor substrate. The terms "above" and "below" as used in this specification therefore describe a relative location of a structural feature to another structural feature with consideration of this orientation.

When referring to semiconductor devices, at least two-terminal devices are meant, an example is a diode. Semiconductor devices can also be three-terminal devices such as a field-effect transistors (FET), insulated gate bipolar transistors (IGBT), junction field effect transistors (JFET), and thyristors to name a few. The semiconductor devices can also include more than three terminals. According to an embodiment, semiconductor devices are power devices. Integrated circuits include a plurality of integrated devices.

Figure 1:
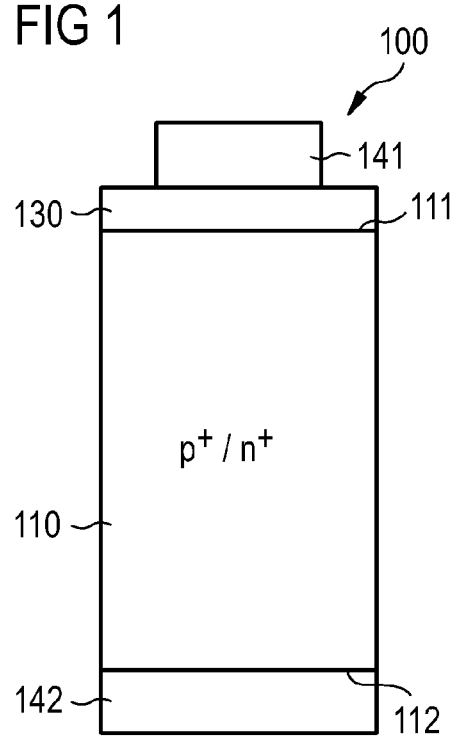
FIG. 1 illustrates a semiconductor device having an amorphous semi-insulating layer as a temperature sensing element according to an embodiment.

With reference to FIG. 1, a first embodiment of a semiconductor device having an amorphous semi-insulating layer used as a temperature sensing element is described. The semiconductor device 100 includes a semiconductor substrate 110 having a first surface 111 and a second surface 112 opposite the first surface 111. The semiconductor substrate 110 can be highly doped, for example in a range from about $10^{15}/cm^3$ to about $10^{21}/cm^3$. For example, the semiconductor substrate 110 can be highly p-doped. In a further embodiment, the semiconductor substrate 110 can be highly n-doped.

An amorphous semi-insulating layer 130 is formed on the first surface 111 of the semiconductor substrate 110. The amorphous semi-insulating layer 130 is in electrical contact with the semiconductor substrate 110 and forms an ohmic contact therewith.

The semiconductor substrate 110 can be made of any semiconductor material suitable for manufacturing semiconductor devices. Examples of such materials include, without being limited thereto, elementary semiconductor materials such as silicon (Si) or diamond, group IV compound semiconductor materials such as silicon carbide (SiC) or silicon germanium (SiGe), binary, ternary or quaternary III-V semiconductor materials such as gallium arsenide (GaAs), gallium phosphide (GaP), indium phosphide (InP), gallium nitride (GaN), aluminium gallium nitride (AlGaN), indium gallium phosphide (InGaPa) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, silicon ($Si_xC_{1-x}$) and SiGe heterojunction semiconductor material. For power semiconductor applications currently mainly Si, SiC and GaN materials are used.

A first metallization 141 is formed on, and in ohmic contact with, the amorphous semi-insulating layer 130. A second metallization 142 is formed on, and in ohmic contact with, the semiconductor substrate 110 on its second surface 112. An electric current can therefore be applied to the amorphous semi-insulating layer 130. The current flow can be in either direction. In a further embodiment, a contact layer can be provided between the amorphous semi-insulating layer 130 and the first metallization 141.

The first and second metallizations 141, 142 can be comprised of a metal or metal alloy. For example, Al, Cu, AlCu, AlSiCu, Ti, W, Pt, Au can be used as material for the first and second metallizations 141, 142.

The conductivity of the semiconductor substrate 110 is sufficiently high so that a current flow between the first and second metallizations 141, 142 is mainly determined by the resistance of the amorphous semi-insulating layer 130. The needed doping concentration for the semiconductor substrate 110 can be selected in view of the thickness of the semiconductor substrate 110 and the nominal resistance of the amorphous semi-insulating layer 130.

FIG. 1 illustrates a semiconductor device 100 with a substantially vertical current flow path between the first and second metallizations 141, 142 arranged on opposite surfaces 111, 112 of the semiconductor substrate 110. The semiconductor device 100 can be used, for example, as a discrete semiconductor element such as a discrete temperature sensor.

Figure 2:
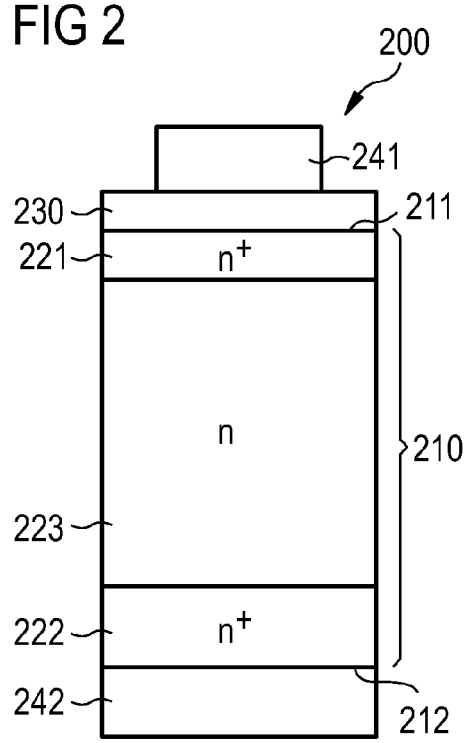
FIG. 2 illustrates a semiconductor device having an amorphous semi-insulating layer as a temperature sensing element according to an embodiment.

With reference to FIG. 2, a further embodiment of a semiconductor device having an amorphous semi-insulating layer used as a temperature sensing element is described. The semiconductor device 200 includes a semiconductor substrate 210 having a first surface 211 and a second surface 212 opposite the first surface 211. The semiconductor substrate 210 can be comprised of any of the above described semiconductor materials.

The semiconductor substrate 210 includes a highly-doped first doping region 221 of a first conductivity type, which is n-type in this embodiment, extending to the first surface 211 of the semiconductor substrate 210. The first doping region 221 can have a surface doping concentration (i.e. a doping concentration at the first surface 211) in a range from about $10^{15}/cm^3$ to about $10^{21}/cm^3$. The semiconductor substrate 210 includes a second doping region 222 extending to the second surface 212 of the semiconductor substrate 210. The second doping region 222 can be of the same conductivity type and can have the same doping concentration as the first doping region 221 or can have a doping concentration different to that of the first doping region 221. In this embodiment, the first and second doping regions 221, 222 are both of n-type. The first and second doping regions 221, 222 can be vertically spaced apart from each other by a third doping region 223 having the same conductivity type as the first and second doping regions 221, 222, but having a lower doping concentration than the first and second doping regions 221, 222. The third doping region 223 can have a doping concentration in a range between $10^{12}/cm^3$ and $10^{16}/cm^3$ which can be the background doping concentration of the semiconductor substrate 210.

An amorphous semi-insulating layer 230 is formed on the first surface 211 of the semiconductor substrate 210. The amorphous semi-insulating layer 230 is in electrical contact with the first doping region 221 and forms an ohmic contact therewith.

A first metallization 241 is formed on, and in ohmic contact with, the amorphous semi-insulating layer 230. A second metallization 242 is formed on, and in ohmic contact with, the second doping region 222 on the second surface 212 of semiconductor substrate 210. An electric current flowing between the first and second metallizations 241, 242 and through the semiconductor substrate 210 can therefore be applied to the amorphous semi-insulating layer 230. The first and second metallizations 241, 242 can be comprised of a metal or metal alloy as described above.

FIG. 2 illustrates a semiconductor device with a substantially vertical current flow path between the first and second metallizations 241, 242 arranged on opposite surfaces of the semiconductor substrate 210. The structure of the semiconductor device 200 is suitable to be integrated as a temperature sensor into an integrated circuit or a power device.

Figure 3:
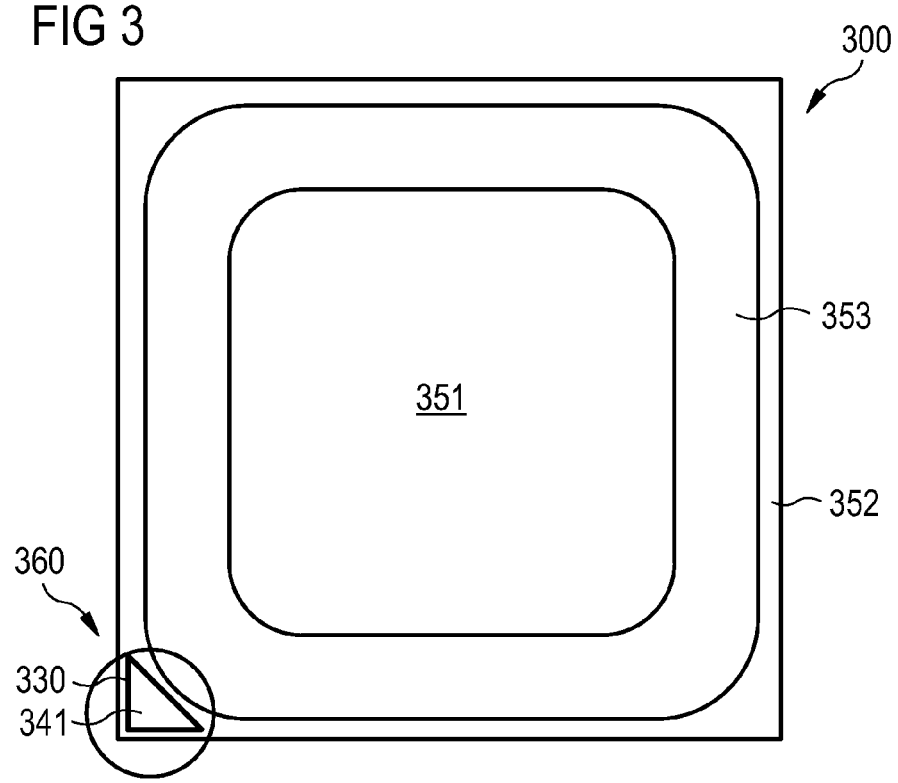
FIG. 3 illustrates a semiconductor device with a temperature element having an amorphous semi-insulating layer according to an embodiment.

FIG. 3 illustrates an embodiment of a temperature sensor integrated into a power device 300. In this particular embodiment, the power device 300 is a diode integrated into a semiconductor substrate. In further embodiments, the power device 300 is a power MOS-FET or an IGBT. FIG. 3 is a plan view onto the power device 300 having an active area and a peripheral area surrounding the active area. The active area is covered by an anode metallization 351. The peripheral area includes a high-voltage termination 353 and a channel stop region 352 which both surround the active area. In this particular embodiment, the channel stop region includes a highly doped n-region 352 formed at a top or first surface of the semiconductor substrate.

A temperature sensor 360 is formed in the peripheral area of the power device 300. The temperature sensor 360 is formed in this embodiment in the channel stop region 352 of the peripheral area. The location of the temperature sensor 360 is indicated by a circle. The temperature sensor 360 includes an amorphous semi-insulating layer 330 and a first metallization 341 arranged on and in ohmic contact with the amorphous semi-insulating layer 330. The first metallization 341 and the anode metallization 351 can be formed together and can be comprised of any of the above described metals or metal alloys. The temperature sensor 360 can have a structure as for instance shown in FIG. 1. The second metallization shown in FIG. 1 can be formed on the entire second surface of the semiconductor substrate and used a cathode metallization and as second terminal for the temperature sensor 360. It is also possible to form separate spaced apart metallization layers for the cathode of the diode and for the temperature sensor 360, respectively.

The high-voltage termination 353 can include an amorphous semi-insulating layer 353 which can be comprised of the same material as used for the amorphous semi-insulating layer 330 of temperature sensor 360.

The structure as illustrated in FIG. 2 can be used to form the temperature sensor 360 shown in FIG. 3 in a vertical power diode. The second doping region 222 is then a part of a field stop layer, the first doping region 221 is then a part of the channel stop region 352, and the third doping region 223 is then a part of the drift region of the power diode.

Figure 4:
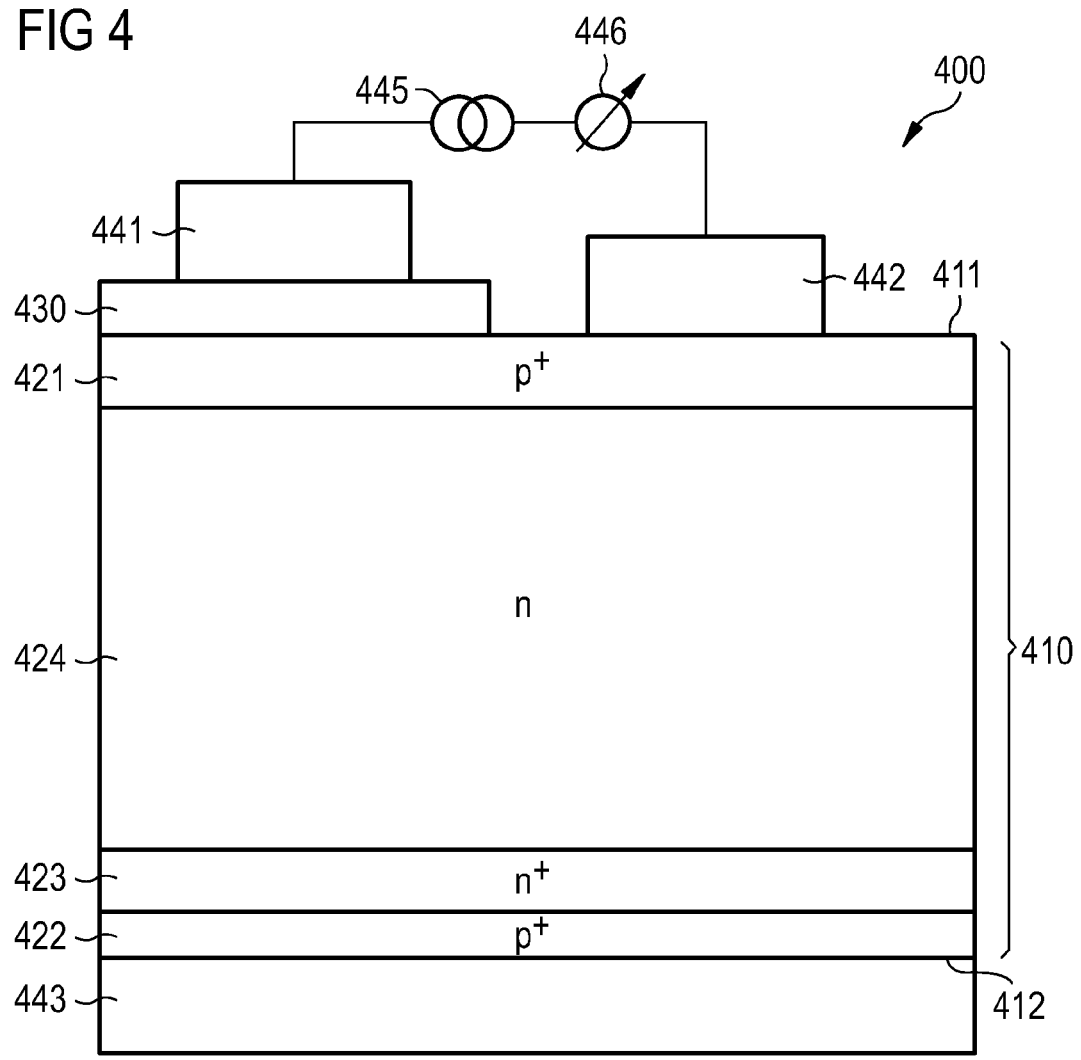
FIG. 4 illustrates a semiconductor device having an amorphous semi-insulating layer as a temperature sensing element according to an embodiment.

With reference to FIG. 4, a further embodiment of a semiconductor device having an amorphous semi-insulating layer used as a temperature sensing element is described. The semiconductor device 400 includes a semiconductor substrate 410 having a first surface 411 and a second surface 412 opposite the first surface 411. The semiconductor substrate 410 can be comprised of any of the above described semiconductor materials.

The semiconductor substrate 410 includes a highly-doped first doping region 421 of a second conductivity type, which is of p-type in this embodiment, extending to the first surface 411 of the semiconductor substrate 410. The first doping region 421 can have a surface doping concentration in a range from about $10^{15}/cm^3$ to about $10^{21}/cm^3$. The semiconductor substrate 410 includes a second doping region 422 extending to the second surface 412 of the semiconductor substrate 410. The second doping region 422 is of the same conductivity type and can have the same doping concentration as the first doping region 421 or can have a surface doping concentration (a doping concentration at the second surface 412) in a range from about $10^{15}/cm^3$ to about $10^{19}/cm^3$. In this embodiment, the first and second doping regions 421, 422 are both of p-type.

A third doping region 423 and a fourth doping region 424 are arranged between the first and second doping regions 421, 422. The third and fourth doping region 423, 424 are both of n-type. The third doping region 423 is highly n-doped while the fourth doping region 424 can have the background doping concentration of the semiconductor substrate 410 which is lower than the doping concentration of the third doping region 423.

The structure as illustrated in FIG. 4 is suitable to be integrated into a peripheral portion of a vertical IGBT. The first doping region 421 is then part of a body region, the second doping region 422 is then part of an emitter region, the third doping region 423 is then part of a field stop layer and the fourth doping region 424 is then part of a drift region of the IGBT.

An amorphous semi-insulating layer 430 is formed on, and covers a part of, the first doping region 421 at the first surface 411 of the semiconductor substrate 410. The amorphous semi-insulating layer 430 is in electrical contact with the first doping region 421 and forms an ohmic contact therewith.

A first metallization 441 is formed on, and in ohmic contact with, the amorphous semi-insulating layer 430. A second metallization 442 is formed on, and in ohmic contact with, another part of the first doping region 421 which is not covered by the amorphous semi-insulating layer 430.

A third metallization 443 is formed on the second surface 412 of the semiconductor substrate 410 and in ohmic contact with the second doping region 422. The first, second and third metallizations 441, 442, 443 can be comprised of any of the metals or metal alloys as described above.

FIG. 4 illustrates a semiconductor device with a lateral current flow path between the first and second metallizations 441, 442 arranged on the same surface of the semiconductor substrate 410.

As illustrated in FIG. 4, a constant current source 445 is connected with the first and second metallizations 441, 442 which form here respective terminals of a temperature sensor formed by the first doping region 421 and the amorphous semi-insulating layer 430. The constant current source 445 can be designed to provide a constant current. The voltage drop over the first doping region 421 and the amorphous semi-insulating layer 430 is then measured by a voltmeter 446. As described above, the first doping region 421 has a conductivity which is typically significantly higher than the conductivity of the amorphous semi-insulating layer 430 so that magnitude of the electric voltage is mainly defined by the resistance of the amorphous semi-insulating layer 430. Since the resistance of the amorphous semi-insulating layer 430 changes with the temperature, the detected voltage drop, which is substantially linear with the temperature, can be used as a measure for determining the temperature. This will be explained further below.

In the structures illustrated in above FIGS. 1 to 4, the current flows vertically through the amorphous semi-insulating layer, i.e. in thickness direction of the amorphous semi-insulating layer. The temperature sensor can be designed such that the current flows in sheet direction of the amorphous semi-insulating layer. A vertical current flow in thickness direction of the amorphous semi-insulating layer is suitable since only a little space is needed. Furthermore, the thickness of the amorphous semi-insulating can be controlled by the deposition conditions. According to an embodiment, electrical connections are therefore provided on opposite surface of the amorphous semi-insulating layer. The electrical connections can be provided by one or more metallizations and/or by one or more doping regions of a semiconductor substrate.

The amorphous semi-insulating layer 130, 230, 330, 430 of the above described embodiments can be comprised of amorphous diamond-like carbon (DLC), amorphous silicon, or amorphous silicon carbide such as $Si_xC_{1-x}$, with $0<x<1$. Depending on deposition conditions the layers may additionally contain a certain amount of hydrogen (up to 60%). The desired temperature-dependent properties, which make these materials suitable as a temperature sensing element, can be tailored according to specific needs.

With respect to FIGS. 5 to 7, specific embodiments including an amorphous diamond-like carbon layer, which is used as an amorphous semi-insulating layer, will be described. The amorphous diamond-like carbon layer will be referred to in the following as a DLC-layer.

The electrical behaviour of amorphous semi-insulating layers such as a DLC-layer is defined, without wishing to be tight to theory, by the morphology of the material. Amorphous layers show a high density of states in the so-called mobility-gap close to the Fermi level. This is different to monocrystalline or polycrystalline layers. Although these states can be easily charged (filled or emptied), only a small current is observable due to the reduced mobility of the charge carriers caused by a limited variable-range hopping at the Fermi level. For this reason, the material is described as semi-insulating.

When applying high electric field strength, the current may increase disproportionally high and a field-induced emission of charge carriers is observed. The current density j(E) obeys, without wishing to be tight by theory, the Poole-Frenkel law as given by:

$$j(E) \propto E \cdot \exp\frac{q\left(-\phi + \sqrt{\frac{qE}{\pi\varepsilon_r\varepsilon_0}}\right)}{kT} \quad (1)$$

with j being the current density, E the electric field strength in the amorphous semi-insulating layer, k the Boltzmann constant, T the absolute temperature, $\varepsilon_r$ the relative dielectric constant of the amorphous semi-insulating layer, $\varepsilon_0$ the electric field constant, q the elementary charge, and $\phi$ the barrier height for the trapped charge carriers.

It is believed that the depth of the traps, which corresponds to the barrier height of the traps, correlates with the optical band gap of the amorphous semi-insulating layers. The higher the optical band gap the higher is the barrier height. On the assumption of this and when introducing a proportionality factor $\sigma_0$, the following relation can be obtained:

$$j(E) = \sigma_0 \cdot E \cdot \exp\frac{q\left(-\phi + \sqrt{\frac{qE}{\pi\varepsilon_r\varepsilon_0}}\right)}{kT} \quad (2)$$

The electric field strength in the amorphous semi-insulating layer follows from the layer thickness d and the voltage drop U across the layer thickness as given by:

$$E = \frac{U}{d} \quad (3)$$

Combining the relationships defined in equations (3) and (2) yields a current-voltage characteristics for the amorphous semi-insulating layers at higher field strengths at which a current based on variable-range hopping is negligible, as given by:

$$j(U) = \frac{\sigma_0 \cdot U}{d} \cdot \exp\frac{q\left(-\phi + \sqrt{\frac{qU}{\pi\varepsilon_r\varepsilon_0 d}}\right)}{kT} \quad (4)$$

This relation is used to describe the measured characteristics as will be explained further below. A linear relation is expected when plotting ln(j/U) as a function of $\sqrt{J}$ or ln (j/E) as a function of $\sqrt{E}$, respectively. Applying Ohm's law j=σ·E, the field-dependent specific conductivity σ(E) can be derived as given by:

$$\sigma(E) = \sigma_0 \cdot \exp\frac{q\left(-\phi + \sqrt{\frac{qE}{\pi\varepsilon_r\varepsilon_0}}\right)}{kT} \quad (5)$$

Relation (5) indicates that there is an electric field range in which the specific conductivity increases or decreases depending on the barrier height $\phi$, because the numerator in the exponent can be positive or negative. This means that the amorphous semi-insulating layer can have a negative temperature coefficient in a low electric field strength range and a positive temperature coefficient in a high electric field strength range. At a given point, at which the numerator becomes zero, any temperature dependence vanishes. This point is defined by:

$$E = \frac{\pi\varepsilon_r\varepsilon_0\phi^2}{q} \quad (6)$$

In order to provide the amorphous semi-insulating layer with a high operational range and a high temperature coefficient, the material used as the amorphous semi-insulating layer is designed to have a sufficiently large barrier height $\phi$.

For example, assuming a desired maximum voltage drop of 20 V, a value $\varepsilon_r=5$ and a layer thickness of 100 nm, the barrier height $\phi$ should be at least 0.48 V to obtain a constant NTC-behaviour of the amorphous semi-insulating layer over the entire voltage range up to 20 V. According to an embodiment, the amorphous semi-insulating layer has a barrier height of at least 0.3 eV. According to an embodiment, the amorphous semi-insulating layer has a barrier height in a range from about 0.3 to 1 eV. According to further embodiments, the amorphous semi-insulating layer has a barrier height in a range from about 0.5 eV to about 1 eV. According to yet further embodiments, the amorphous semi-insulating layer has a barrier height in a range from about 0.5 eV to about 0.8 eV.

The above desired material properties can be adjusted, for example, by appropriately selecting the deposition conditions when forming the amorphous semi-insulating layer. For manufacturing, an amorphous semi-insulating layer is deposited, for example on a surface of a semiconductor substrate or any other suitable substrate which is typically conductive. In a further process, the deposited amorphous semi-insulating layer is annealed. A typical anneal temperature range is, for example, between 300° C. and 600° C.

The amorphous semi-insulating layer can be deposited, for example by Plasma Enhanced Chemical Vapour Deposition (PECVD). Further parameters for tailoring the electrical behaviour of the amorphous semi-insulating layer are pressure, RF-power used during deposition, the gas flow rates of the used gases, the DC-bias in the plasma, which is self adjusting, and the doping concentration.

For example, the following parameters can be selected and used for depositing a DLC-layer. The deposition of an appropriate DLC-layer can e.g. be performed in a PECVD-chamber where the RF-power is capacitively coupled at a frequency of 13.56 MHz. The ratio of anode and cathode area determines the DC-bias in the plasma. The DC-bias grows with increasing area ratio and RF-power, respectively, whereas an increase in pressure has the contrary effect. Any gaseous hydrocarbon like methane can be used as an appropriate precursor. Typical process conditions for the deposition on a wafer with 6 inch diameter can be e.g. a flow rate of 150 sccm, a pressure of 80 mTorr and a RF-power of 200 Watt. The self-bias value in the plasma adjusts typically around −350V. The DC-bias has direct impact on the optical band gap and the resistivity of the DLC-layer, which increase with decreasing self-bias. According to an embodiment, the DC-bias is adjusted to be in a range from about −100 V to about −1000 V. According to an embodiment, the DC-bias is adjusted to be in a range from about −200 V to about −500 V. According to an embodiment, the RF-power is adjusted to be in a range from about 50 W to about 1200 W. According to an embodiment, the RF-power is adjusted to be in a range from about 100 W to about 800 W.

The choice of the layer thickness depends on the desired resistor value. According to an embodiment, a typical range can be between 10 nm and 1 μm. On the other hand, the deposition parameters can be varied in order to change the resistivity at fixed layer thickness. A typical range for the flow rate is from 50 to 300 sccm, for the pressure from 10 to 300 mTorr and for the power from 50 to 1200 Watt.

Such formed DLC-layers have a resistance with a good linearity and a high temperature coefficient which make them suitable as a temperature sensing element. According to an embodiment, the amorphous semi-insulating layer has an electrical resistance which varies substantially linear with respect to the temperature in a temperature range between −40 and 250° C.

According to an embodiment, the specific conductivity σ of the amorphous semi-insulating layer is from about $10^{-3}/\Omega \cdot cm$ to about $10^{-15}/\Omega \cdot cm$. According to an embodiment, the specific conductivity σ of the amorphous semi-insulating layer is from about $10^{-8}/\Omega cm$ to about $10^{-12}/\Omega cm$.

The measurements described below were conducted using a sample having a 300 nm thick DLC-layer deposited on a front side or first surface of a highly p-doped Si-substrate having a specific resistance of about 5 mΩcm. A metal contact having a diameter of about 1 mm, which metal contact corresponds to the above described first metallization, was formed on the DLC-layer and comprised of a Ti/Pt/Au layer stack. A larger Al-layer was formed on the backside or second surface of the Si-substrate and served as the second metallization described above. The structure used for the measurements substantially corresponds to the structure illustrated in FIG. 1.

Providing a Si-substrate with a high doping concentration is desirable to prevent formation of any barrier or depletion layer on the amorphous-crystalline junction formed between the amorphous DLC-layer and the monocrystalline Si-substrate. This allows to freely chose the direction of the current to be supplied. A symmetrical characteristic with respect to the current can therefore be obtained which is beneficial for the evaluation electronics used to evaluate the current flowing through the DLC-layer. Moreover, the highly doped Si-substrate exhibits only a negligible voltage drop.

A semiconductor substrate having a low background doping can be used alternatively. To prevent formation of a parasitic barrier or depletion layer between the DLC-layer and the semiconductor substrate and to provide a good ohmic connection to the backside metallization, highly doped doping regions having the same conductivity type as the semiconductor substrate can be formed at the front and the backside of the semiconductor substrate. A corresponding structure is illustrated in FIG. 2. The voltage drop over the semiconductor substrate caused by the weekly doped semiconductor substrate is typically small in comparison with the voltage drop over the DLC-layer.

Figure 5:
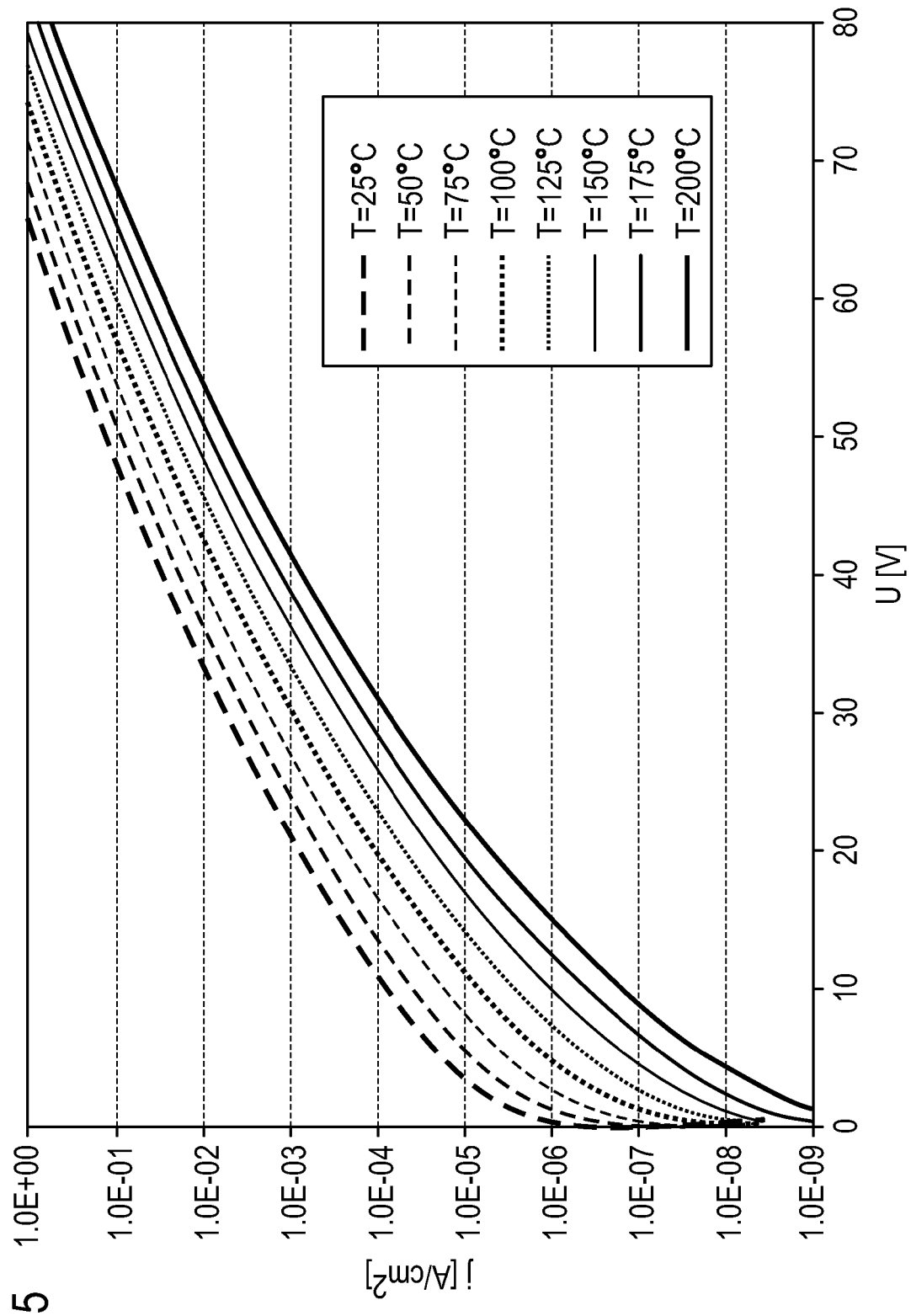
FIG. 5 shows the current-voltage characteristic of a temperature sensor having a DLC-layer as a temperature sensing element according to an embodiment.

The current-voltage characteristics of the above mentioned sample measured by different temperatures are shown in FIG. 5. The specific conductivity and the barrier height φ were tailored by applying deposition conditions as described above. Specifically, the DLC-layer was doped with Si in a range of about 30 at %, wherein at % means the proportion relative to the number of atoms. The measured characteristics exhibit a substantially linear course or graph when plotting σ as a function of $\sqrt{E}$ as illustrated in FIG. 6. This demonstrates that conduction behaviour of the DLC-layer is defined by the Poole-Frenkel law as presented above.

Figure 6:
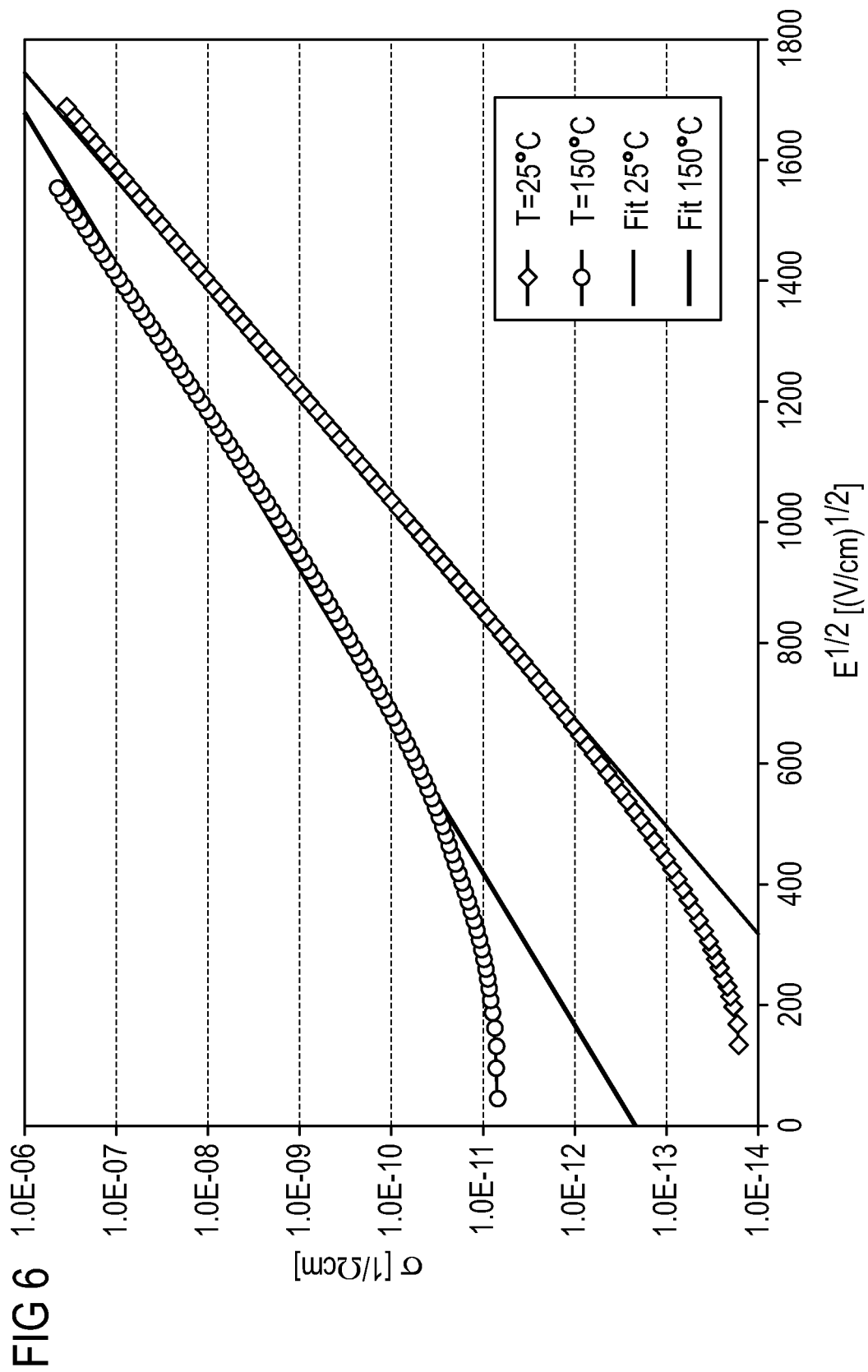
FIG. 6 shows the dependence of the conductivity from the electrical field strength of a temperature sensor having a DLC-layer as temperature sensing element according to an embodiment.

In FIG. 6, σ=j/E is plotted as a function of $\sqrt{E}$. The solid lines were calculated and fitted according to equation (5). For the sake of clarity, only two characteristics measured for different temperatures are presented in FIG. 6.

The best fit for all graphs obtained for different temperatures produced the following parameters: $\sigma_0=7.5 \cdot 10^{-6}/\Omega cm$, $\in_r=5.2$ and φ=0.63V. At low field strength, the influence of the field-strength independent hopping conduction, or the so-called phonon-assisted tunneling, increases which explains the deviation between the measured values and the fit at low field strength. However, at high field strength, a good correlation between the Poole-Frenkel law and the measured values is observable. The DLC-layer should therefore be operated in the appropriate electric field range which is defined by the barrier φ which can be adjusted by appropriately selecting the deposition conditions.

The temperature coefficient may decrease when further increasing the electric field since the straight lines used for fitting will meet at a given point. The point of intersection, for this specific embodiment, is at $E=3.6 \cdot 10^6 V/cm$ when using equation (6).

Referring back to FIG. 5, when operating, for example, at a voltage of about 30V, the specific conductivity j varies with a factor of about 100 between 25° C. and 200° C. which is suitable for many applications such as monitoring the temperature of a power device.

Figure 7:
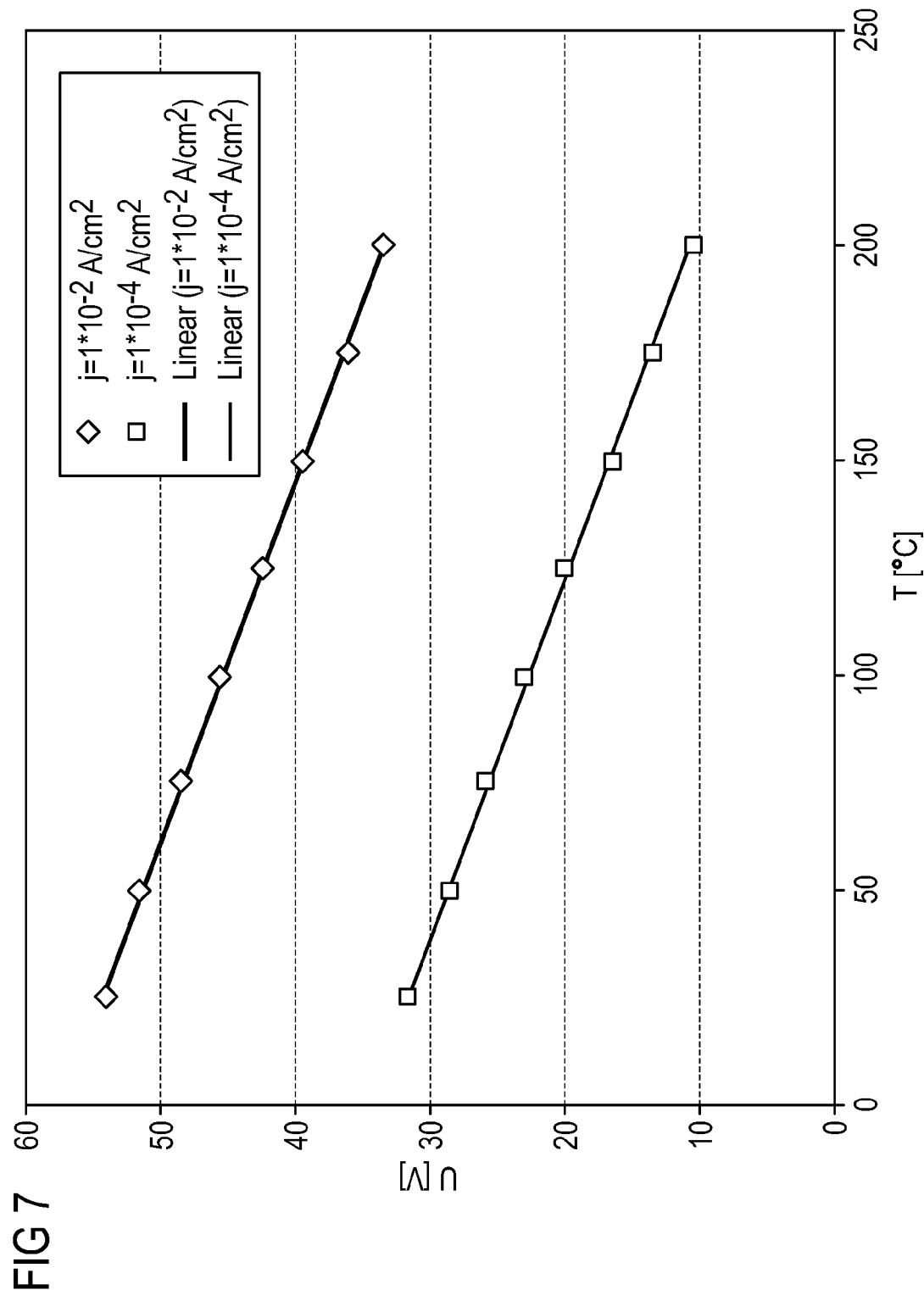
FIG. 7 shows the temperature dependence of the voltage drop over a DLC-layer for different current densities according to an embodiment.

The temperature depending voltage drop is plotted as a function of the temperature for current densities of $10^{-4}$ A/cm$^2$ and $10^{-2}$ A/cm$^2$ in FIG. 7. Both plots show a very good linearity over a temperature range between 25° C. and 200° C. Furthermore, the temperature coefficient of the DLC-layer is basically constant in this range and has a comparably high value of about −120 mV/° C., which is much higher than the temperature coefficient of a Pt100 resistor or of a pn-junction. This allows a much higher temperature resolution. The voltage drop varies, depending on the applied current density, between about 10 V and 30 V and between about 33 V and 53 V, respectively. According to an embodiment, the amorphous semi-insulating layer has a temperature coefficient of at least 10 mV/° C., and particularly of at least 20 mV/° C.

The above presented measurement results show that an amorphous DLC-layer, unlike polycrystalline or monocrystalline DLC-layers, is suitable as a temperature sensing element. Such produced amorphous DLC-layers are designed to have a high barrier height to produce a high temperature coefficient over a large operational range. The amorphous semi-insulating layers are particularly designed to have a linear NTC-behaviour over the desired operational range with a high and substantially constant temperature coefficient.

The operational range can also be tailored by appropriately selecting the thickness of the DLC-layer. When changing the thickness of the DLC-layer while keeping the current density constant, the voltage drop changes and so the temperature coefficient. For illustration purposes, assuming a decrease of the layer thickness from 300 nm to 100 nm at an otherwise constant current of 1 mA and an active area of both DLC-layers (a 100 nm thick layer and a 300 nm thick layer) of about 1 mm$^2$, the voltage drop changes from a range of about 48 V to 69 V for the 300 nm thick layer to a range of about 16 to 23 V for the 100 nm thick layer in the temperature range from about 25° C. to about 200° C. The temperature value also decreases about a factor 3, i.e. from about 120 mV/° C. to about 40 mV/° C.

In comparison to temperature sensors which use the forward voltage drop of a pn-junction, the temperature coefficient of the amorphous semi-insulating layer can be tailored to be sufficiently constant so that the amorphous semi-insulating layer can have a temperature sensing sensitivity which is higher by a factor of at least 10. In addition to that, the variations of the manufacturing can be kept small. Particularly, the optical band gap, which correlates to the barrier height, the dielectric constant and the thickness can be controlled to be within a desired range. This allows manufacturing of temperature sensors with small deviations between separately manufactured sensors and allows dispensing of separate calibrations.

The above embodiments, although specifically described in connection with Si, can also employ other semiconductor materials as described above such as SiC, GaAs or GaN.

For manufacturing of discrete temperature sensors, the amorphous semi-insulating layer can be deposited onto a semiconductor substrate followed by formation of metal layers on the semi-insulating layer and the opposite side of the semiconductor substrate, and then separation into separate devices. Alternatively, any of the above described structures can be integrated in a chip design of a power device or an integrated circuit. This is particularly beneficial for devices which already include a DLC-layer used as edge passivation. A temperature sensor can be, for example, placed in an inactive region of the chip.

It is to be understood that the features of the various exemplary embodiments described herein may be combined with each other, unless specifically noted otherwise.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor substrate;
   an active area and a peripheral area surrounding the active area;
   an edge passivation formed in the peripheral area; and
   an amorphous semi-insulating layer on the semiconductor substrate, wherein the amorphous semi-insulating layer has an electrical resistance with a negative temperature coefficient and has a specific conductivity from about $10^{-8}$ Ωcm to about $10^{-15}$ Ωcm;
   wherein the amorphous semi-insulating layer is formed in the peripheral area.

2. A semiconductor device according to claim 1, wherein the amorphous semi-insulating layer has an electrical resistance which varies substantially linear with respect to temperature in a temperature range between −40° C. and 250° C.

3. A semiconductor device according to claim 1, wherein the amorphous semi-insulating layer has an optical band gap of about 0.8 eV to about 3 eV.

4. A semiconductor device according to claim 1, wherein the amorphous semi-insulating layer has a bather height φ in a range from about 0.3 eV to 1.0 eV.

5. A semiconductor device according to claim 1, further comprising:
   a doping region formed in the semiconductor substrate, wherein the amorphous semi-insulating layer is in ohmic contact with the doping region; and
   a metallization in ohmic contact with the amorphous semi-insulating layer, wherein the amorphous semi-insulating layer provides an electrical connection between the metallization and the doping region.

6. A semiconductor device according to claim 5, wherein the doping region has a doping concentration of at least $1 \cdot 10^{15}/cm^3$.

7. A semiconductor device according to claim 1, wherein the amorphous semi-insulating layer is a diamond-like carbon layer.

8. A semiconductor device according to claim 1, wherein:
   the edge passivation comprises a layer comprised of diamond-like carbon; and the amorphous semi-insulating layer is comprised of diamond-like carbon.

9. A semiconductor device according to claim 1, wherein the amorphous semi-insulating layer is spaced from the edge passivation.

10. A temperature sensor, comprising an amorphous semi-insulating layer comprised of amorphous diamond-like carbon or amorphous $Si_xC_{1-x}$ with $0<x<1$, having an electrical resistance with a negative temperature coefficient and having a specific conductivity from about $10^{-8}$ Ωcm to about $10^{-15}$ Ωcm.

11. A temperature sensor according to claim 10, further comprising:
    a semiconductor substrate comprising a first surface and a first doping region arranged at the first surface, the amorphous semi-insulating layer being arranged on and in ohmic contact with the first doping region; and
    a first metallization on and in ohmic contact with the amorphous semi-insulating layer.

12. A temperature sensor according to claim 11, wherein the first doping region has a doping concentration of at least $1 \cdot 10^{15}/cm^3$.

13. A temperature sensor according to claim 11, further comprising a second metallization on and in ohmic contact with the first doping region, the first and second metallizations being spaced apart from each other.

14. A temperature sensor according to claim 11, further comprising a second metallization on and in electrical with a second surface of the semiconductor substrate.

15. A method of manufacturing a semiconductor device, comprising:
    providing a semiconductor substrate; and
    forming an amorphous semi-insulating layer on the semiconductor substrate, wherein the amorphous semi-insulating layer is comprised of amorphous diamond-like carbon or amorphous $Si_xC_{1-x}$ with $0<x<1$ and has an electrical resistance with a negative temperature coefficient and a specific conductivity from about $10^{-8}$ Ωcm to about $10^{-15}$ Ωcm.

16. A method according to claim 15, wherein the amorphous semi-insulating layer is deposited on the semiconductor substrate.

17. A method according to claim 16, wherein the amorphous semi-insulating layer is deposited on the semiconductor substrate by plasma deposition with a DC-bias in a range from about −100 V to about −1000 V.

18. A method according to claim 16, wherein the amorphous semi-insulating layer is deposited on the semiconductor substrate by plasma deposition with RF-power in a range from about 50 W to about 1200 W.

19. A method according to claim 15, further comprising annealing the amorphous semi-insulating layer.

20. A method according to claim 15, further comprising:
    forming a first doping region in the semiconductor substrate;
    forming the amorphous semi-insulating layer on a portion of the first doping region;
    forming a first metallization on and in ohmic contact with the amorphous semi-insulating layer; and
    forming a second metallization on and in ohmic contact with the first doping region.

21. A method according to claim 15, further comprising:
    forming a first doping region at a first surface of the semiconductor substrate;
    forming the amorphous semi-insulating layer on the first doping region;
    forming a first metallization on and in ohmic contact with the amorphous semi-insulating layer;
    forming a second doping region at a second surface of the semiconductor substrate; and
    forming a second metallization on and in ohmic contact with the second doping region.

* * * * *

UNITED STATES PATENT AND TRADEMARK OFFICE
CERTIFICATE OF CORRECTION

PATENT NO.         : 8,710,615 B2                                    Page 1 of 1
APPLICATION NO.    : 13/222048
DATED              : April 29, 2014
INVENTOR(S)        : G. Schmidt It is certified that error appears in the above-identified patent and that said Letters Patent is hereby corrected as shown below:

In the Claims:
Column 12, line 37 (claim 1, line 10) please change "Ωcm to" to -- /Ωcm to --
Column 12, line 37 (claim 1, line 10) please change "Ωcm;" to -- /Ωcm; --
Column 12, line 48 (claim 4, line 2) please change "a bather height" to -- a barrier height --
Column 13, line 10 (claim 10, line 5) please change "Ωcm to" to -- /Ωcm to --
Column 13, line 11 (claim 10, line 6) please change "Ωcm." to -- /Ωcm. --
Column 13, line 37 (claim 15, line 7) please change "and has" to -- , and has --
Column 14, line 2 (claim 15, line 9) please change "Ωcm to" to -- /Ωcm to --
Column 14, line 3 (claim 15, line 10) please change "Ωcm." to -- /Ωcm. --

Signed and Sealed this
Twenty-second Day of July, 2014

Michelle K. Lee
*Deputy Director of the United States Patent and Trademark Office*